United States Patent [19]
Devin et al.

[11] Patent Number: 6,141,254
[45] Date of Patent: Oct. 31, 2000

[54] METHOD FOR PROGRAMMING AN EPROM-FLASH TYPE MEMORY

[75] Inventors: Jean Devin; Alessandro Brigati, both of Aix en Provence; Bruno Leconte, Rousset, all of France

[73] Assignee: STMicroelectronics S.A., Gentilly, France

[21] Appl. No.: 09/355,064

[22] PCT Filed: Jan. 22, 1998

[86] PCT No.: PCT/FR98/00111

§ 371 Date: Nov. 22, 1999

§ 102(e) Date: Nov. 26, 1999

[87] PCT Pub. No.: WO98/33187

PCT Pub. Date: Jul. 30, 1998

[30] Foreign Application Priority Data

Jan. 22, 1997 [FR] France .................................. 9700642

[51] Int. Cl.⁷ .................................................. G11C 16/00
[52] U.S. Cl. ............................... 365/185.28; 365/185.12; 365/185.17
[58] Field of Search ......................... 365/185.28, 185.33, 365/185.11, 185.12, 185.17, 185.18

[56] References Cited

U.S. PATENT DOCUMENTS

| | | | |
|---|---|---|---|
| 5,615,147 | 3/1997 | Chang et al. | 365/185.18 |
| 5,717,636 | 2/1998 | Dallabora et al. | 365/185.11 |
| 5,978,265 | 11/1999 | Kirisawa et al. | 365/185.17 |
| 5,991,199 | 11/1999 | Brigati et al. | 365/185.12 |

Primary Examiner—Tan T. Nguyen
Attorney, Agent, or Firm—Theodore E. Galanthay; Stephen C. Bongini; Fleit, Kain, Gibbons, Gutman & Bongini P.L.

[57] ABSTRACT

This invention relates to a method for programming a Flash-EPROM type memory (1) comprising words of memory cells arranged in rows (23) and columns (31), in which a floating-gate transistor (7) acts as a storage device, the floating-gate transistors of the memory cells (2–9) in the same word (10) have their control gate connected to the same word line connection (30) and their source connected to the same main electrode (29) of a selection transistor (26), the other main electrode (28) of which is connected to a vertical word source connection (25), in which M memory cells (2, 2b) are programmed simultaneously in N different words (10, 200) during a single programming cycle, where M is less than the number P of memory cells in a word, and where M, N and P are integer numbers.

8 Claims, 3 Drawing Sheets

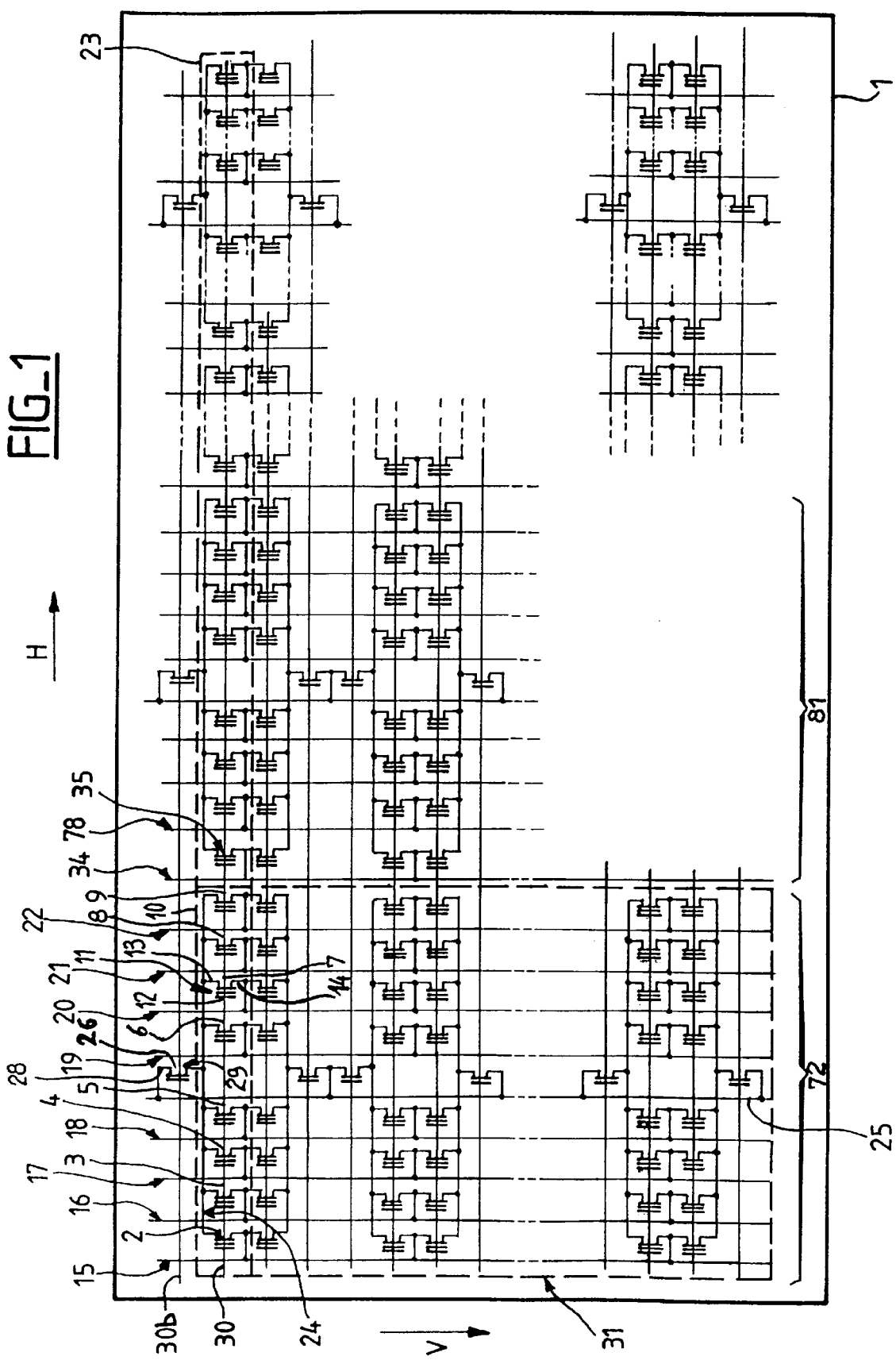

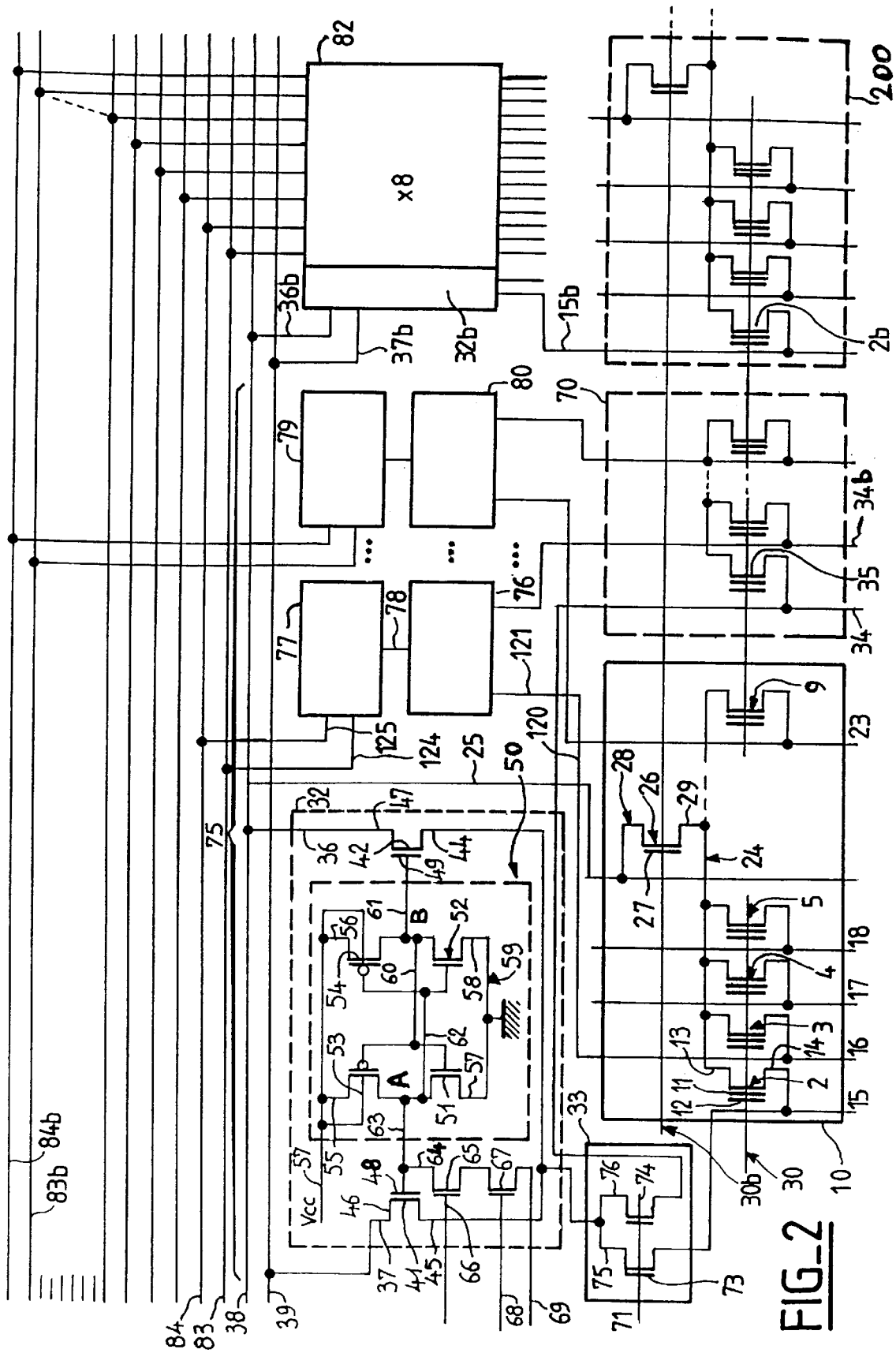
FIG_2

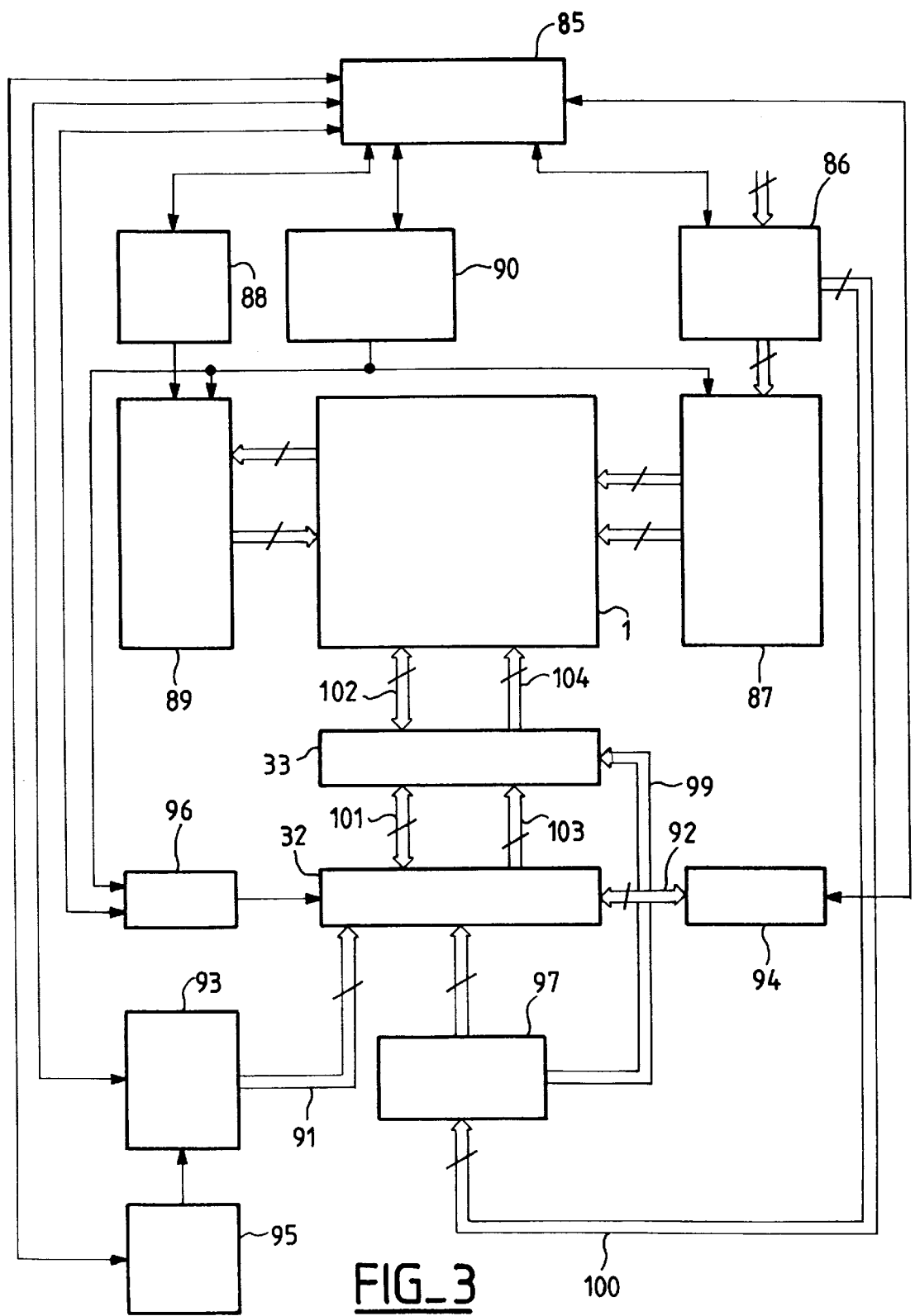
FIG_3

METHOD FOR PROGRAMMING AN EPROM-FLASH TYPE MEMORY

The present invention relates to a method for programming a Flash-EPROM type memory.

In this type of memory, each information storage element or memory cell consists of a floating-gate MOS transistor that may be in two states. Thus, in the case of an N channel MOS transistor, in a first state called an erased state, no negative charge, or even a positive charge, is trapped at the floating gate. A conduction channel can then exist between the source and drain of this transistor. In a second state called a programmed state, electrons are trapped at the floating gate. They therefore prevent the creation of a conduction channel in the substrate between the source and drain. In this case, the transistor is off and behaves like an open circuit.

In a Flash-EPROM type memory, the passage of an electron from the conduction channel to the floating gate is done by a so-called hot electron method. To this end, high voltages are applied between the control gate and the drain of this same floating-gate transistor while the source is connected to the ground. These voltages enable the passage of very high-energy electrons (hot electrons), coming from the channel thus created, to the floating gate. The electrons are then trapped in the floating gate and constitute an information element. The removal of the charges, or erasure, is prompted by a tunnel effect.

A memory array consists of words comprising, in one example, at least eight cells each capable of containing a binary information element (namely one of the two previous states). FIG. 1 shows a partial view of an architecture of this kind. These cells may be selected individually. They are arranged in rows and columns.

In a standard architecture, all the floating-gate transistors of the memory cells of one and the same word, in other words in a same byte, have their control gate connected to one and the same voltage source by a word line and their source connected to one and the same main electrode of a selection transistor by a connection. This selection transistor permits or does not permit the biasing of the source of the floating-gate transistors of the word. An architecture of this kind with a selection transistor of this kind is described in the patent application EP-A-0 704 851, conform with the preamble to claim 1. The utility of the selection transistor is that it prevents the depletion of the floating-gate transistor of a cell and thus provides perfect uniformity of the threshold voltage of the cells that are the object of an erasure.

This same selection transistor has its other main electrode, namely its drain or source electrode, connected to a source vertical connection of words that are vertically adjacent. The vertically adjacent words are therefore on different rows. This selection transistor enables the biasing or non-biasing of the common sources of the floating-gate transistors of one and the same word. These words have Q bytes. If Q=1, the word has one byte. The control gates of the floating-gate transistors of the cells of the words of one and the same row are connected to one and the same word line. Furthermore, the control gates of the selection transistors of the words of one and the same row are connected to one and the same word selection line receiving an associated selection signal that is often identical to the signal applied to the word line.

With an architecture of this kind, there are constraints that limit programming of several memory cells of one and the same word during one and the same programming cycle. Indeed, during the programming operation, the control gate of each cell of one and the same row is subjected to a high voltage. The drain of the floating-gate transistor of a cell that is selected to be programmed is taken to a high voltage that is high enough to accelerate charges in a channel. The source of this floating-gate transistor is connected to the ground. This high voltage enables charges to acquire high energy, and produces a high current through this channel (500 $\mu$A/cell). Thus for one byte, the current produced during this programming may be in the range of 4 mA. This current is far too high since the vertical connection of the source is limited in size and cannot withstand a current of this magnitude. For example, if many cells were to be programmed in the same word, the current produced would cause the metal film to be torn off the source vertical connection by an electromigration phenomenon. Furthermore, at the same time this current increases the source potential of the floating gate transistors which reduces the programming efficiency.

The purpose of this invention is to overcome this disadvantage. The invention proposes a method for programming a Flash-EPROM type memory containing words of memory cells arranged in rows and columns, in which a floating gate transistor acts as a storage device, the floating gate transistors of the memory cells in one and the same word having their control gate connected to the same word line connection and their source connected to one and the same main electrode of a selection transistor, the other main electrode of which is connected to a word source vertical connection. According to this method, M memory cells in N different words are processed simultaneously in one and the same programming cycle, where M is less than the number P of memory cells for a word, and M, N and P are integer numbers.

Consequently, the current on the solicited vertical source connections is proportional to M. M is preferably equal to 1 (M=1). This solution can considerably reduce the current in each word, and therefore enables a lower potential at the source of the word floating-gate transistors. Furthermore according to the invention, a cell for one word is programmed at the same time as a cell for another word is being programmed. For example, N words with P bits each then take P/M cycles to program.

According to other advantageous characteristics of the invention that may be taken alone or in combination:

The N different words belong to the same row of memory cells;

M is not equal to 1, for example two or four if P is equal to eight;

all memory cells are programmed with a determined word during the P/M successive programming cycles;

the M memory cells simultaneously programmed in the N different words are cells with the same rank in the said words.

To arrive at this result, the memory architecture has been adapted so that the bit lines in cells of the same rank, and which are to be programmed in adjacent cells, are connected together.

Furthermore, the cells in a word are usually erased before they are programmed. When erasing a selected word, a high negative voltage of the order of −6V is applied by the word line to the control gates of the floating-gate transistors of this word. The voltage applied to the sources of the floating-gate transistors of this same word is of the order of 10V. A problem then arises for a floating-gate transistor of a cell that is located on a same row but has not been selected, namely at its control gate it receives the same negative voltage as this first word. Even if it does not receive the high voltage on its source, this situation sometimes causes partial erasure of this cell in this word that was not selected for programming. In other words, the negative voltage eliminates charges on its floating gate. This ultimately causes erroneous reading of this word.

The present invention proposes to resolve this second problem by a sequence of operations to be performed. The operation starts by programming all cells of the memory of one and the same row. They are then all erased. It is then determined whether or not the cells have undergone any depletion due to the negative voltages applied during the erasure operations. If they have, they are slightly reprogrammed in order to make their threshold voltage at a level identical to that of the other erased memory cells.

Programming is then started in accordance with the invention, i.e. one of the eight bits in eight different words is programmed simultaneously. After all these operations have been performed, a final operation known as a refreshment operation is performed. This operation consists of verifying if the negative voltage applied to certain unselected cells belonging to the same row as the programmed cell during the erasure phase, has caused a slight erasure to these unselected cells, or more specifically verifying if these programmed cells have lost charges on their floating gate. If they have lost their charges, these cells are reprogrammed (refreshed) by a new programming step.

To summarize, programming of a given memory word includes the following operations or steps:
  select all cells in the word;
  program all the said selected cells at the same threshold voltage level;
  erase all the said selected cells;
  verify if any of the said selected cells have been depleted;
  if they have, slightly reprogram these depleted selected cells in order to bring their threshold voltage to exactly the same level as that of other erased cells;
  program the selected cells to be programmed during P/M programming cycles.

Furthermore, since the control gates of floating-gate transistors of memory cells of one and the same row are connected to one and the same line of words and the control gates of word selection transistors in the same row are connected to one and the same word selection row, programming also includes the following final operations, referred to as refreshment operations;
  verify to determine if there has been any loss of charge in memory cells not selected in the same row;
  and if there is any loss of charge, slightly reprogram the memory cells in order to correct their threshold voltage to their previous level.

Other features and advantages of the present invention will appear from the following description of various embodiments. This description is made hereinafter with reference to the attached drawings, in which:

FIG. 1 is a schematic view of the circuit of a prior art Flash-EPROM type memory organized in words of eight cells;

FIG. 2 gives a schematic view of a row of words of the Flash-EPROM memory in FIG. 1 provided with a bias circuit associated with a multiplexer according to the present invention;

FIG. 3 gives a schematic overall view of the peripheral circuits of the Flash-EPROM memory comprising in particular the bias circuit and its associated multiplexer.

In the description and the drawings, the same elements bear the same references.

FIG. 1 shows a Flash-EPROM type memory 1 comprising cells 2 to 9 organized in words, such as the first word 10.

Therefore in the example, the memory words comprise eight memory cells (P=8). Consequently, the term "byte" will frequently be used herein to refer to a word of memory cells.

The memory cells, for example cell 7, comprise a floating-gate transistor acting as a storage unit in the cells (the cells and the corresponding floating-gate transistors bear the same reference numbers throughout the description). This transistor 7 has a floating gate 11, a control gate 12 and two main electrodes 13 and 14 respectively.

The control gate electrodes 12 of the first word 10 are connected to the same word line connection 30. The drain main electrode 14 of transistors 2 to 9 of the cells of the first word 10 is connected to a row connection of differentiated bits 15 to 22 of this word. The other main electrode 13, namely the source electrode of the transistors 2 to 9 of a first word 10, is connected to a source connection 24 of this word. This connection 24 is itself connected to a vertical source connection 25 by means of a selection transistor 26. This selection transistor 26 has a control gate 27 and two main electrodes 28 and 29 respectively. The main electrode 28 is connected to the vertical source connection 25. The electrode 29 is connected to the source connection 24 of the word 10. The transistor 26 control gate receives word selection signals conveyed by a connection 30b.

Memory 1 consists of vertical sets or columns 31 of words such as word 10, positioned vertically, with a composition identical to that of the word 10. The drain electrodes of floating-gate transistors of cells of words in the same column such as 31 are then connected to the same bit lines, such as bit lines 15 to 22 in the first word 10. The vertical source connection 25 is common to the words in one and the same column such as column 72. Two vertically adjacent words are two words located side by side, with no other word between them, on one and the same vertical line V shown in the Figure.

Memory 1 is also composed of horizontal sets or rows of words such as word 10, laid out horizontally. The control gate electrodes of floating-gate transistors of cells of the words of one and the same row such as row 23 are connected to one and the same word line such as word line 30 of the first word 10. Two horizontally adjacent words are two words located side by side, with no other word between them, on the same horizontal line H shown in the Figure.

All these words arranged vertically and horizontally determine a matrix.

During an operation to program a memory cell, the voltage of the word line 30 and of the connection 30b is increased to 12V. Using a bias circuit, the voltage of a selected line of bits such as 15 to 22, to which the cell to be programmed is connected, is increased to 6V. The connection 25 is then connected to the ground thus grounding all the sources of the floating gate transistors of the word containing the selected cell by conduction through the selection transistor 26. During simultaneous programming of several memory cells in the same word, this would create an excessively high current damaging the connection 25 and limiting the efficiency of the programming.

A description is now given, with reference to FIG. 2, of an embodiment of programming method according to the invention. FIG. 2 shows a row of the matrix of memory 1. In a particular embodiment of the invention, a bias circuit 32 is used with a multiplexer 33 to connect a bit line 15 to two common programming connections 38, 39 through two connection links, respectively 36 and 37.

The principle is that a bit line such as 15 of a cell 2, with a given rank in a first word 10, and at least one bit line such as 15b of a memory cell 2b in at least one second word 200, preferably a cell with the same rank in the word, are connected to the same two common programming connections, 36 and 37 respectively, by means of different bias circuits 32 and 32b. The circuit 32b is connected to the common programming connections 38, 39 by two link connections 36b and 37b respectively.

Thus, at least one cell (and M cells in the general case) in two different words (in N different words in the general case) are programmed at the same time, in other words simultaneously, during a single programming cycle. The first and second words above are preferably in the same row in the memory matrix, since they can thus be selected simultaneously by one and the same word line 30 when programming. Thus this facilitates decoding of word lines of cells in the memory matrix. However, other arrangements are possible.

Furthermore, the first and second words above may be horizontally adjacent words. However, this is not the case in the embodiment described below. As we will now describe, the sixteen rows of bits in two horizontally adjacent words such as words 10 and 70 are associated in pairs with eight bias circuits such as circuit 32. Thus, circuit 32 is used for programming the eight cells 2 to 9 in word 10, and also for programming the eight cells in word 70, depending on the state of the multiplexer 33. This limits the number of bias circuits necessary in the memory. These circuits take up a great deal of space on the doped polysilicon substrate.

The bias circuit 32 has two bias voltage inputs corresponding to link connections 36 and 37 respectively, and a bias voltage output corresponding to a distribution connection 43. This output 43 is connected to the input of a multiplexer 33.

The multiplexer 33 has two transistors 73, 74, of which one, 73, is a P type transistor, while the other transistor, 74, is an N type transistor. The output 43 is connected, firstly, to a main electrode 75 of the transistor 73, and, secondly, to the main electrode 76 of the transistor 74. The other two main electrodes of these two transistors 73 and 74 are connected respectively to a bit line connection such as 15 in word 10 and 34 in word 70. The operation of this optional multiplexer will be explained later.

The circuit 32 has two bias transistors 41 and 42. The distribution connection 43 is connected to first main electrodes 44 and 45 of these two transistors 41 and 42. The other main electrodes 46 and 47 of these two transistors 41 and 42 are connected to the two link connections 37 and 36 respectively.

Control gate electrodes 48, 49 of these transistors 41 and 42 respectively are connected to a circuit 50 that outputs the data to be programmed. This output circuit 50 is a storage circuit to store a value and a complementary value of a binary data element to be programmed.

In one example, this storage circuit comprises four transistors including two N type transistors, 51 and 52 respectively, and two P type transistors, 53 and 54 respectively, mounted together as a SCHMITT trigger. The two transistors 53 and 54 have their main electrodes, 55 and 56 respectively, connected to a connection 57 that is itself connected to a power supply voltage Vcc. These transistors, 53 and 54 respectively, are in series with the other two transistors, 51 and 52 respectively, through their other main electrode. The mid-points of the transistors pairs 51, 53 and 52, 54 are denoted terminals A and B. The other main electrodes 57 and 58 of the two transistors 51 and 52 are connected to a connection 59 connected to the ground.

The control gate electrodes of the two transistors 53 and 54 are connected to the control gate electrodes of the two transistors 51 and 52 respectively. These connections are themselves connected to terminals B and A through connections 60 and 62 respectively. Terminal B is connected to the control gate electrode 49 of the transistor 42 by the connection 61. Similarly, terminal A is connected to the control gate electrode 48 of the bias transistor 41 by the connection 63. The two connections 61 and 63 are the two outputs of the output circuit 50 used to control transistors 41 and 42 in opposition.

The data element is carried into circuit 50, by forcing terminal A to the potential required, by a sequence of transistors 65 and 67 in series. The connection 63 is linked to the main electrode 64 of the transistor 65. The transistor 65 is connected in series to transistor 67 through its other main electrode. The transistor 67 has a control gate 68 and another main electrode 69. The data to be programmed is applied to the main electrode 69 of transistor 67. The gate 68 controls whether or not the data element to be programmed can pass. The transfer of the data elements into the circuits 50 takes place at the time of application of a pace-setting signal to the connection 68. All the connections 68 in the different bias circuits 32 are connected to each other. The electrode 66 of the transistor 65 is connected to the output of a bit line decoder.

Before programming, the voltages necessary for selecting and conditioning some of all the memory output circuits 50, are applied through connections 66 and 68. A high voltage is applied to connection 66 in selected circuits 50. The voltage at connection 69 in selected circuits is then set to high voltage or to zero depending on the value of the data element to be programmed.

The circuit 50 outputs the data element to be programmed. The circuit 50 outputs two complementary logical states on its two outputs 61 and 63. Therefore this bias circuit 32 transmits one of the two allowable voltages at its two inputs 36 and 37, to its output 43. The data element to be programmed is programmed in cell 2, by applying a pair of voltages meaning preparation for programming to the two common programming connections 38 and 39. In one example, this pair of voltages is equal to 6 volts carried on connection 38 and 2 volts carried on connection 39. The bias circuits such as circuit 32 which are connected to cells that (for the time being) are not to be programmed, receive a pair of voltages meaning programming is inhibited. In one example, this pair of inhibition voltages is equal to 2 volts and 2 volts, carried on the other common connections such as 83 and 84.

In one example, there are eight pairs of common connections such as 38, 39. For each word, there are eight bias circuits such as circuit 32, each of which receives one of these pairs of common connections on its two respective inputs. The two inputs in the first bias circuit 32 are connected to the first pair of common connections 38, 39. The two inputs 124 and 125 of a second bias circuit 77 are connected to the second pair of common connections 83 and 84. Circuit 77 selectively biases two lines of bits 16 or 34b depending on the value of the command received by its associated multiplexer 76. The multiplexers are all controlled by the signal transmitted on connection 71. The bit line 16 is horizontally adjacent to bit line 15, as bit line 34b is horizontally adjacent to bit line 34. The two inputs of an eighth bias circuit 79 are connected to the eighth pair of common connections 83b, 84b. These eight circuits belong to a first group 75 of bias circuits.

As described above, a group of eight bias circuits like this is used for selective programming of cells of two words, preferably horizontally adjacent, such as words 10 and 70. In other words, group 75 of these eight bias circuits can bias two words 10 and 70 in the same row of the memory matrix.

Another group 82 of eight bias circuits is connected under the same conditions to common programming connections 38, 39, 83, 84 as far as 83b, 84b. This group 82 comprises sixteen outputs representing the outputs from the eight multiplexers and sixteen inputs connected to the eight common programming connections.

The two inputs, such as 36 and 37, of each bias circuit with the same rank in group 82 as a bias circuit in group 75, are connected to the same pair of common connections.

To program a single cell, the voltages on a single pair of common connections are set to the programming voltage pair (6 volts, 2 volts). All other voltages are set to the inhibiting voltage pair (2V, 2V). There are as many (N) groups simultaneously connected to the same common connections as there are words containing cells that are to be programmed at the same time.

To program all cells in word 10, the common connections 38 and 39, then 83, 84, . . . , 83b, 84b are increased successively to the pair of programming voltages (6V, 2V), all other connections being set to the inhibiting voltage pair (2V, 2V). And so on until 83b, 84b. An eight-bit word, in other words an eight-memory cell word, is programmed in eight different cycles.

According to a specific embodiment, the bit line 15 of a memory cell (of a given rank) of word 10 is twinned with a bit line 34 of a memory cell (preferably of the same rank to avoid confusion of connections such as 200, 121) of word 70 that is directly adjacent horizontally to this first word 10. Twinning is done by the multiplexing circuit 33. The circuit 33 routes the output 43 from circuit 32 to either of these bit lines 15 or 34 as a function of a command applied to connection 71. The command enables transmission of the programming (or inhibiting) potential to only one of these two bit lines at a time. In other words, either bit line 15 or bit line 34 is biased, and hence either cell 2 or cell 35 belonging to word 81 is programmed.

The memory array of the memory 1 is thus organized in two distinct interleaved pages. A first page comprises the word 10 and a second page comprises the word 70. The two pages thus comprise groups 72 and 81 of vertically adjacent words, respectively (FIG. 1). The principle is that all the cells of a word are programmed successively in the first page and then all the cells of a word are programmed successively in the second page. The command applied to connection 71 is therefore changed once every eight programming cycles.

The reason for the presence of the multiplexer 33 is that the circuits 32 take up a lot of space. Since it is necessary to have eight of them for eight bit lines (to program the cells of an 8-cell word), it means that bit lines 15 to 23 have to be spaced (FIG. 2). By introducing the multiplexers 33, it is possible to store twice the number of bit lines, those in word 10 and those in word 70, in the space occupied by the eight bias circuits in the group 75.

Interleaving of words such as 10 and 70 has been described. However, it is possible to interleave the cells directly. In this case, cell 35 would be placed adjacent to cell 2 (instead of cell 3 which would be set aside). This latter method would have the advantage of reducing the surface area occupied: there would no longer be any horizontal connection 200, 121 passing above word 10 or word 70. In practice, the height would be reduced by fourteen thicknesses of these connections 200, 121.

With the particular embodiment of the invention described above, it can be seen that the memory array of the Flash EPROM type memory made may include twice as many bit lines as the number of bit lines in a conventional EEPROM memory (for example 1024 bit lines on one word line instead of 512). In a conventional EEPROM memory, the number of bias circuits is the same as the number of bit lines. In this case, there are twice as many bit lines. Furthermore, specifications about EEPROM memories prohibit programming more than 64 bit lines at the same time. A multiplexing circuit according to the invention can control two bit lines of the same rank successively, corresponding to two horizontally adjacent words in interleaving.

The memory array for memory 1 is programmed by a sequence of operations.

During a first operation, cells such as 2 to 9 in a word such as word 10 on the first page 72 are selected under the control 71 of the multiplexing circuit 33.

Then preferably, during a second operation, all cells 2 to 9 on the same page are programmed to the same level in order to obtain a uniform threshold voltage for each cell in the selected page. During a third operation, all selected cells 2 to 9 are erased. During erasing, the bias voltage applied to the control gate electrode of a word 10 is of the order of −6V. This voltage is applied to all cells in the same word line such as 30, regardless of whether or not the page is selected. Furthermore, the voltage at the source electrode is increased to the order of 10V. The impedance of the drain electrode is made high. Erasing requires a series of several very short duration pulses, of the order of 100 μs. Firstly, when erasing, these voltages may cause depletion in cells such as 2 to 9 in a selected page. Secondly, this same voltage minus 6 V is applied to the control gate electrode of cells such as cell 35 in an unselected page. This negative voltage causes a loss of charge on their floating gate and a tendency to slightly erase them (referred to as parasite erasure).

Before starting programming of selected cells such as 2 to 9 in a selected page, a check is made to determine if any depletion has occurred in the cells. If so, then they are slightly reprogrammed so that they return to their threshold voltage that had become too low after erasing. Similarly, unselected cells such as cell 35 on an unselected page in which parasite erasure may have occurred, in other words a loss of charge due to the high voltage applied to the word line such as word line 30 that occurred when erasing cells 2 to 9 before programming them, will be reprogrammed (or refreshed).

FIG. 3 shows a Flash-EPROM type memory 1 surrounded by its peripherals symbolically comprising a bias circuit 32 associated with a multiplexer 33. The Figure shows a microcontroller 85 used to control the operation of an address counter 86. This counter 86 enables addressing of a row decoder 87. This counter 86 includes eight inputs and 256 outputs corresponding to the number of word lines existing in the memory 1. A negative voltage charge pump 88, controlled by microcontroller 85, supplies a voltage changeover switch 89 connected to the memory 1. This changeover switch 89 can be used to obtain a negative voltage for erasure or a positive voltage for programming on word lines selected by the decoder 87.

A charge pump 90, controlled by the microcontroller 85, energizes the word line decoder 87, the voltage changeover switch 89 and a source line changeover switch 96. A bit line decoder 97 and the word line decoder 87 enable application of potentials to the connections of the memory 1, these potentials representing information elements to be recorded in the memory cells or representing commands to write or read information in the cells. Furthermore, the bias circuit 32 is connected to a circuit 93 of data elements to be programmed, through the microcontroller 85. The circuit 93 outputs the data elements to be programmed to output circuits 50. The circuit 32 has data buses at its input and output to convey data elements read and to be written. These are buses 92 and 91 respectively. Bus 92 is connected to a read circuit 94 controlled by the microcontroller 85. The circuit 93 and the circuit 94 enable biasing of the two inputs, 38 and 39 respectively, of the bias circuit 32, in write mode (programming or erasure) or in read mode. For practical reasons, the circuit 93 is connected to a drain charge pump 95 controlled by the microcontroller 85. The pump 95 enables the supply of a high current of the order of 4 mA (one cell consumes a current of the order of 500 $\mu A$) on the common connection 38. The circuit 95, 93, 91 enables biasing the second input 39 of the bias circuit 32.

The circuit 32 is connected to a control bus 99 from the bit line decoder 97 and outputting a signal corresponding to either of the two pages to be programmed. The input to this bit line decoder 97 is also connected to the address counter 86 by an address bus 100. The output of the bias circuit 32 comprises a data bus 101 in which the number of connections corresponds to the total number of bias circuits 32 enabling the programming of the entire memory, namely 512 bias circuits. In one example, this memory 1 has 1024 bit lines.

Finally, the multiplexer (33) is connected to the memory 1 by an address bus 102 for which the number of wires corresponds to the number of bit lines existing in memory A. Two buses 103 and 104 enable the selection of the source lines by sending control signals to the transistors 26.

The novelty of the invention lies especially in the presence of the microcontroller 85 and circuits 32, 33, 89, 93, 95 and 96. The microcontroller 85 executes a program for programming the cells in a single word, one after the other, during successive and different programming cycles. This program implements the programming method according to the invention.

In the above, an example embodiment of the method has been described in which one cell (M=1) has been programmed in each of the N words. However in the general case, it is possible to simultaneously program M cells in each word where M is not equal to 1, and M is always less than the number of cells P in a word. For example, M may be chosen to be two (M=2) or four (M=4) if P is equal to eight. This can increase the speed of programming of a word of memory cells. It is known that P/M programming cycles are necessary to program N words of P memory cells, namely four or two cycles respectively in the above examples.

What is claimed is:

1. A method for programming a Flash-EPROM type memory (1) comprising words of memory cells arranged in rows (23) and columns (31), in which a floating-gate transistor (7) acts as a storage device, the floating-gate transistors of the memory cells (2–9) of one and the same word (10) have their control gate connected to the same word line connection (30) and their source connected to the same main electrode (29) of a selection transistor (26), the other main electrode (28) of which is connected to a vertical word source connection (25), characterized in that during a single programming cycle, M memory cells (2,2*b*) are programmed simultaneously in N different words (10, 200), where M is less than the number P of memory cells in a word, and where M, N and P are integer numbers.

2. Method according to claim 1, characterized in that the N different numbers belong to the same row of memory cells.

3. Method according to claim 1 or according to claim 2, characterized in that M is equal to 1.

4. Method according to claim 1 or according to claim 2, characterized in that M is not equal to one, for example it is equal to two or four if P is equal to eight.

5. Method according claim 1, characterized in that all the memory cells of a determined word are programmed during P/M successive programming cycles.

6. Method according to claim 1, characterized in that the M memory cells programmed simultaneously in the N different words are cells of the same rank in the said words.

7. Method according to claim 1, characterized in that programming of a given word in the memory comprises the following operations or steps:

select all cells in the word;

program all the said selected cells to the same threshold voltage level;

erase all the said selected cells;

verify if any of the said selected cells are depleted;

if so, slightly reprogram these selected depleted cells so that their threshold voltage is at exactly the same level as that of other erased cells;

program cells selected to be programmed during P/M programming cycles.

8. Method according to claim 7, characterized in that the control gates of floating-gate transistors of memory cells in one and the same row are connected to one and the same word line and the control gates of word selection transistors of one and the same row are connected to one and the same word selection line, and programming then also includes the following final operations, called refreshment operations:

verify if any of the unselected memory cells in the same row have lost their charge;

and if so, slightly reprogramming these memory cells in order to correct their threshold voltage to their previous level.

* * * * *